United States Patent
Tour et al.

(10) Patent No.: US 8,158,203 B2
(45) Date of Patent: Apr. 17, 2012

(54) METHODS OF ATTACHING OR GRAFTING CARBON NANOTUBES TO SILICON SURFACES AND COMPOSITE STRUCTURES DERIVED THEREFROM

(75) Inventors: James M. Tour, Bellaire, TX (US); Bo Chen, Sugar Land, TX (US); Austen K. Flatt, Sugar Land, TX (US); Michael P. Stewart, Mountain View, CA (US); Christopher A. Dyke, Houston, TX (US); Francisco Maya, Beaverton, OR (US)

(73) Assignee: William Marsh Rice University, Houston, TX (US)

( * ) Notice: Subject to any disclaimer, the term of this patent is extended or adjusted under 35 U.S.C. 154(b) by 893 days.

(21) Appl. No.: 11/579,614

(22) PCT Filed: May 6, 2005

(86) PCT No.: PCT/US2005/016102
§ 371 (c)(1),
(2), (4) Date: Sep. 18, 2008

(87) PCT Pub. No.: WO2005/114708
PCT Pub. Date: Dec. 1, 2005

(65) Prior Publication Data
US 2009/0042136 A1   Feb. 12, 2009

Related U.S. Application Data

(60) Provisional application No. 60/568,484, filed on May 6, 2004, provisional application No. 60/645,814, filed on Jan. 21, 2005.

(51) Int. Cl.
*B05D 3/10* (2006.01)

(52) U.S. Cl. ........ 427/301; 427/299; 427/258; 977/892; 977/847

(58) Field of Classification Search .............. 427/301, 427/258, 299; 977/892, 847
See application file for complete search history.

(56) References Cited

U.S. PATENT DOCUMENTS 6,290,564 B1 * 9/2001 Talin et al. ............. 445/50
(Continued)

FOREIGN PATENT DOCUMENTS

WO   WO 02/60812   8/2002
(Continued)

OTHER PUBLICATIONS

Combing and Bending of Carbon Nanotube Arrays with Confined Microfluidic Flow on Patterned Surfaces Hyunhyub Ko,, Sergiy Peleshanko, and, Vladimir V. Tsukruk The Journal of Physical Chemistry B 2004 108 (14), 4385-4393.*

(Continued)

*Primary Examiner* — Frederick Parker
*Assistant Examiner* — Alex Rolland
(74) *Attorney, Agent, or Firm* — Winstead PC

(57) ABSTRACT

The present invention is directed toward methods of attaching or grafting carbon nanotubes (CNTs) to silicon surfaces. In some embodiments, such attaching or grafting occurs via functional groups on either or both of the CNTs and silicon surface. In some embodiments, the methods of the present invention include: (1) reacting a silicon surface with a functionalizing agent (such as oligo(phenylene ethynylene)) to form a functionalized silicon surface; (2) dispersing a quantity of CNTs in a solvent to form dispersed CNTs; and (3) reacting the functionalized silicon surface with the dispersed CNTs. The present invention is also directed to the novel compositions produced by such methods.

14 Claims, 14 Drawing Sheets

U.S. PATENT DOCUMENTS

| | | | |
|---|---|---|---|
| 6,645,455 | B2 | 11/2003 | Margrave et al. |
| 6,716,409 | B2 | 4/2004 | Hafner et al. |
| 7,550,071 | B1* | 6/2009 | Dirk et al. ............... 205/457 |
| 7,682,590 | B2* | 3/2010 | Sakakibara et al. ....... 423/447.1 |

FOREIGN PATENT DOCUMENTS

| | | |
|---|---|---|
| WO | WO 2004/024428 | 3/2004 |
| WO | WO 2005/114708 | 12/2005 |

OTHER PUBLICATIONS

Direct Covalent Grafting of Conjugated Molecules onto Si, GaAs, and Pd Surfaces from Aryldiazonium Salts Michael P. Stewart,, Francisco Maya,, Dmitry V. Kosynkin,, Shawn M. Dirk,, Joshua J. Stapleton,, Christine L. McGuiness,, David L. Allara,, and, James M. Tour, Journal of the American Chemical Society 2004 126 (1), 370-378.*

Ozonation of Single-Walled Carbon Nanotubes and Their Assemblies on Rigid Self-Assembled Monolayers Lintao Cai,, Jeffrey L. Bahr,, Yuxing Yao, and, James M. Tour Chemistry of Materials 2002 14 (10), 4235-4241.*

Kroto et al., "C60: Buckmisterfullerene", Nature (1985) 318, pp. 162-163.

Kratschmer et al., "Solid C60: A New Form of Carbon", Nature (1990) 347, pp. 354-358.

Iijima et al., "Helical Microtubules of Graphitic Carbon", Nature (1991) 354, pp. 56-58.

Ebbesen et al,. "Large-Scale Synthesis of Carbon Nanotubes", Nature (1992) 358, pp. 220-222.

Ebbesen et al., "Carbon Nanotubes", Ann. Rev. of Mater. Science (1994) 25, pp. 15174-15182.

Iijiman et al., "Single-shell Carbon Nanotubes of 1-nm diameter", Nature (1993) 363, pp. 603-605.

Saito et al., "Physical Properties of Carbon Nanotubes", Imperia College Press, London (1998).

Sun et al., "Creating the Narrowest Carbon Nanotubes", Nature, (2000) 403, 384.

Qin et al., "Electron Microscopic Imaging and Contrast of Smallest Carbon Nanotubes", Chem. Phy. Letters (2001) 349, pp. 389-393.

Wang et al., "The Smallest Carbon Nanotube", Nature (2000) pp. 50-51.

Hafner et al., "Catalytic Growth of Single-Wall Carbon Nanotubes from Metal Particles", Chem. Physics Letters (1998) 296, pp. 195-202.

Cheng et al., "Bulk Morphology and Diameter Distribution of Single-Walled Carbon Nanotubes Synthesized . . . ", Chem. Phy. Lett. (1998) 289, pp. 602-610.

Nikolaev et al., "Gas-Phase Catalytic Growth of Single-Walled Carbon Nanotubes . . . ", Chem. Physics Letters (1999) 313, pp. 91-97.

Thess et al., "Crystalline Ropes of Metallic Carbon Nanotubes", Science (1996) 273, pp. 483-487.

Vander Wal et al., "Flame and Furnace Synthesis of Single-Walled and Multi-Walled Carbon Nanotubes . . . ", J. Phys. Chem. B. (2001) 105, pp. 10249-10256.

Baughman et al., "Carbon Nanotubes—the Route Toward Applications", Science (2002) 297, pp. 787-792.

Rao et al., "Functionalised Carbon Nanotubes from Solutions", Chem. Commun. (1996) pp. 1525-1526.

Wong et al., "Covalently Functionalized Nanotubes as Nanometresized Probes in Chemistry and Biology", Nature (1998) 394, pp. 52-55.

Liu et al., "Fullerene Pipes", Science (1998) 280, pp. 1253-1256.

Chen et al., "Solution Properties of Single-Walled Carbon Nanotubes", Science (1998) 282, pp. 95-98.

Aihara et al., "Lack of Superaromaticity in Carbon Nanotubes", J. Phys. Chem. (1994) 98, pp. 9773-9776.

Mickelson et al., "Solvation of Fluorinated Single-Wall Carbon Nanotubes in Alcohol Solvents", J. Phys. Chem. (1999) 103, pp. 4318-4322.

Boul et al., "Reversible Sidewall Functionalization of Buckytubes", Chem. Physics Letters (1999) 310, pp. 367-372.

Chen et al., "Chemical attachment of Organic Functional Groups to Single-Walled Carbon Nanotube Material", J. Mater. Res., (1998) 13, pp. 2423-2431.

Bahr et al., "Covalent Chemistry of Single-Wall Carbon Nanotubes", J. Mater. Chem. (2002) 12, pp. 1952-1958.

Banerjee et al., "Rational Chemical Strategies for Carbon Nanotube—Functionalization", Chem. Eur. J. (2003) 9, pp. 1898-1908.

Holzinger et al., "Sidewall Functionalization of Carbon Nanotubes", Angew. Chem. Int. Ed. (2001) 40, pp. 4002-4005.

Khabashesku et al., "Fluorination of Single-Wall Carbon Nanotubes and Subsequest Derivatization Reactions", Acc. Chem. Res. (2002) 35, pp. 1087-1095.

Dyke et al., "Covalent Functionalization of Single-Walled Carbon Nanotubes for Materials Applications", J. Phys. Chem. A. (2004) 108, pp. 11151-11159.

Bahr et al., "Dissolution of Small Diameter Single-Wall Carbon Nanotubes in Organic Solvents", Chem. Commun. (2001) pp. 193-194.

Dyke et al., "Solvent-Free Functionalization of Carbon Nanotubes", J. Am. Chem. Soc. (2003) 125, pp. 1156-1157.

Stewart et al., "Direct Covalent Grafting of Conjugated Molecules onto Si, GaAs, and Pd Surfaces . . . ", J. Am. Chem. Soc. (2004) 126, pp. 370-378.

Dyke et al., "Overcoming the Insolubility of Carbon Nanotubes through High Degrees of Sodewall Functionalization", Chem. Eur. J. (2004) 10, pp. 812-817.

Chiang et al., "Purification and Characterization of Single-Wall Carbon Nanotubes (SWNTs) Obtained from the Gas-Phase . . . ", J. Phys. Chem. (2001) 105, pp. 8297-8301.

Dyke et al., "Separation of Single-Walled Carbon Nanotubes on Silica Gel . . . ", J. Am. Chem. Soc. (2005) 127, pp. 4497-4509.

Bachilo et al., "Structure-Assigned Optical Spectra of Single-Walled Carbon Nanotubes", Science (2002) 298, pp. 2361-2366.

Weisman et al., "Dependence of Optical Transition Energies on Structure for Single-Walled Carbon Nanotubes . . . ", Nano Letters (2003) 3, pp. 1235-1238.

O'Connell et al., "Band Gap Fluorescence from Individual Single-Walled Carbon Nanotubes", Science (2002) 297, pp. 593-596.

O'Connell et al., "Reversible Water-Solubilization of Single-Walled Carbon Nanotubes by Polymer Wrapping", Chem. Phys. Lett. (2001) 342, pp. 265-271.

Hudson et al., "Water-Soluble, Exfoliated, Nonroping Single-Wall Carbon Nanotubes", J. Am. Chem. Soc. (2004) 126, pp. 11158-11159.

Bahr et al., "Highly Functionalized Carbon Nanotubes Using in Situ Generated Diazonium Compounds", Chem. Mater. (2001) 13, pp. 3823-3824.

Dyke et al., "Unbundled and Highly Functionalized Carbon Nanotubes from Aqueous Reactions", Nano Letters (2003) 3, pp. 1215-1218.

Strano et al., "Electronic Structure Control of Single-Walled Carbon Nanotube Functionalization", Science (2003) 301, pp. 1519-1522.

Dyke et al., "Diazonium-Based Functionalization of Carbon Nanotubes: XPS and GC-MS Analysis and Mechanistic Implications", SynLett (2004) 1, pp. 155-160.

Flatt et al., "Orthogonally Functionalized Oligomers for Controlled Self-Assembly", J. Org. Chem. (2004) 69, pp. 1752-1755.

Pollack et al., "Sequential Deprotection for Control of Orientation in the Self-Assembly of Asymmetric Molecules for Molecular . . . ", Langmuir (2004) 20, pp. 1838-1842.

Hickman et al., "Toward Orthogonal Self-Assembly of Redox Active Molecules on Pt and Au: Selective Reaction of Disulfide . . . ", Langmuir (1992) 8, pp. 357-359.

Walker et al., "Bifunctional, Conjugated Oligomers for Orthogonal Self-Assembly: Selectivity Varies from Planar . . . ", J. Am. Chem. Soc. (2004) 126, pp. 16330-16331.

Fan et al., "Charge Transport throught Self-Assembled Monolayers of Compounds of Interest in Molecular Electronics", J. Am. Chem. Soc. (2002) 124, pp. 5550-5560.

Ko et al., "Combining and Bending of Carbon Nanotube Arrays with Confined Microfluidic Flow on Patterned Surfaces", J. Phys. Chem. B. (2004) 108, pp. 4385-4393.

Lavastre et al., "Selective and Efficient Access to Ortho, Meta and Para Ring-substituted Phenylacetylene . . . ", Tetrahedron (1997) 53. pp. 7595-7604.

Bahr et al., "Functionalization of carbon nanotubes by electrochemical reduction of aryl diazonium salts: a bucky paper electrode", J. Am. Chem. Soc., 2001, 123:6536-6542.

Kosynkin et al., "Phenylene ethynylene diazonium salts as potential self-assembling molecular devices", Org. Lett., 2001, 3:993-995.

Kosynkin et al, "Self-assembly of phenylene ethynylene diazonium salts on metal surfaces as potential molecular wires", Mater. Res. Soc. Symp. Proc., 2001, 660:JJ3.5.1-JJ3.5.5.

Gardner et al., "Systems for orthogonal self-assembly of electroactive monolayers on Au and ITO: an approach to molecular electronics", J. Am. Chem. Soc., 1995, 117:6927-6933.

Kimball et al., "Triazenes: a versatile tool in organic synthesis", Angew. Chem. Int. Ed., 2002, 41:3338-3351.

Holmes et al., "Efficient synthesis of a complete donor/aceptor bis(aryl)diyne family", Synth. Commun., 2003, 33:2447-2462.

Maya et al., "Formation and analysis of self-assembled monolayers from u-shaped oligo(phenylene ethynylene)s as candidates for molecular electronics", Chem. Mater., 2004, 16:2987-2997.

* cited by examiner

1, R = NO₂
2, R = H

Scheme 1

Scheme 2

Scheme 3

Scheme 4

Scheme 5

Scheme 6

Scheme 7

METHODS OF ATTACHING OR GRAFTING CARBON NANOTUBES TO SILICON SURFACES AND COMPOSITE STRUCTURES DERIVED THEREFROM

CROSS-REFERENCE TO RELATED APPLICATIONS

This application is the 35 U.S.C. §371 national phase application of international application PCT/US2005/016102, filed May 6, 2005, which claims priority to the following U.S. Provisional Patent Application Ser. No. 60/568,484, filed May 6, 2004; and Ser. No. 60/645,814, filed Jan. 21, 2005.

This invention was made with government support under Grant Nos. NASA-JSC NCC9-77 and URETI NCC-01-0203, both awarded by the National Aeronautics and Space Administration; Grant Nos. DMR-0073046 and DMR-0213623, both awarded by the National Science Foundation; Air Force Office of Scientific Research Grant No. F49620-01-1-0364, awarded by the U.S. Department of Defense; Office of Naval Research Grant No. N00014-01-1-0657, awarded by the U.S. Department of Defense; Army Research Office Grant No. DAAD19-02-1-0064, awarded by the U.S. Department of Defense; and the Defense Advanced Research Projects Agency (DARPA/ONR) Grant No. N00014-01-1-0657, awarded by the U.S. Department of Defense. The government has certain rights in the invention.

FIELD OF THE INVENTION

The present invention is related generally to carbon nanotube materials, and more specifically to methods of chemically attaching carbon nanotubes to silicon surfaces and the compositions that result therefrom.

BACKGROUND

Fullerenes are closed-cage molecules composed entirely of $sp^2$-hybridized carbons, arranged in hexagons and pentagons. Fullerenes (e.g., $C_{60}$) were first identified as closed spheroidal cages produced by condensation from vaporized carbon (Kroto et al., Nature, 1985, 318:162; and Krätschmer et al., Nature, 1990, 347:354). Fullerene tubes, being elongated tubular fullerenes, are produced in carbon deposits on the cathode in carbon arc methods of producing spheroidal fullerenes from vaporized carbon—although numerous other methods exist for making them. See Iijima, Nature, 1991, 354:56-58; Ebbesen et al., Nature, 1992, 358:220; and Ebbesen et al., Annual Review of Materials Science, 1994, 24:235-264. Such tubes are referred to herein as carbon nanotubes. Many of the carbon nanotubes made by these processes were multi-wall nanotubes (MWNTs), i.e., the carbon nanotubes resembled concentric cylinders having multiple walls or shells arranged in a manner analogous to that of Russian "nesting dolls." Carbon nanotubes having up to seven walls have been described in the prior art (Ebbesen et al., Annual Review of Materials Science, 1994, 24:235-264; Iijima et al., Nature, 1991, 354:56-58).

Single-wall carbon nanotubes (SWNTs) were discovered in 1993 in soot produced in an arc discharge in the presence of transition metal catalysts (Iijima et al., Nature, 1993, 363: 603-605). Such SWNTs, comprised of a single tube of carbon atoms, are the smallest of the carbon nanotubes. SWNTs can typically have lengths of up to several micrometers (millimeter-long nanotubes have been observed) and diameters of approximately 0.5 nm-10.0 nm (Saito et al., *Physical Properties of Carbon Nanotubes*, 1998, London: Imperial College Press; Sun et al., Nature, 2000, 403:384), although most have diameters of less than about 2 nm (Saito et al.). Diameters as small as 0.4 nm have been reported, but these were formed inside either MWNTs (Qin et al., Chem. Phys. Lett., 2001, 349:389-393) or zeolites (Wang et al., Nature, 2000, 408:50-51). SWNTs, and carbon nanotubes of all types have since been produced by other techniques which include chemical vapor deposition (CVD) techniques (Hafner et al., Chem. Phys. Lett., 1998, 296:195-202; Cheng et al., Chem. Phys. Lett., 1998, 289:602-610; Nikolaev et al., Chem. Phys. Lett., 1999, 313:91-97), laser ablation techniques (Thess et al., Science, 1996, 273:483-487), and flame synthesis (Vander Wal et al., J. Phys. Chem. B., 2001, 105(42): 10249-10256).

Since their discovery, there has been a great deal of interest in the functionalization (sometimes referred to as derivatization) of carbon nanotubes and, more particularly, in single-wall carbon nanotubes, to facilitate their manipulation, to enhance the solubility of such nanotubes, and to make the nanotubes more amenable to blend and composite formation. This is because single-wall carbon nanotubes are one of the more striking discoveries in the chemistry and materials genre in recent years. Such nanotubes posses tremendous strength, an extreme aspect ratio, and are excellent thermal and electrical conductors. A plethora of potential applications for nanotubes have been hypothesized, and some progress is being made towards commercial applications (Baughman et al., Science, 2002, 297:787-792). Accordingly, chemical modification of single-wall carbon nanotubes, as well as multi-wall carbon nanotubes, will be necessary for some applications. For instance, such applications may require grafting of moieties to the nanotubes: to allow assembly of modified nanotubes, such as single-wall carbon nanotubes, onto surfaces for electronics applications; to allow reaction with host matrices in polymer blends and composites; and to allow the presence of a variety of functional groups bound to the nanotubes, such as single-wall carbon nanotubes, for sensing applications. And once blended, some applications may benefit from the thermal removal of these chemical moieties, as described in PCT publication WO 02/060812 by Tour et al., filed Jan. 29, 2002.

While there have been many reports and review articles on the production and physical properties of carbon nanotubes, reports on chemical manipulation of nanotubes have been slow to emerge. There have been reports of functionalizing nanotube ends with carboxylic groups (Rao, et al., Chem. Commun., 1996, 1525-1526; Wong, et al., Nature, 1998, 394: 52-55), and then further manipulation to tether them to gold particles via thiol linkages (Liu, et al., Science, 1998, 280: 1253-1256). Haddon and co-workers (Chen, et al., Science, 1998, 282:95-98) have reported solvating single-wall carbon nanotubes by adding octadecylamine groups on the ends of the tubes and then purportedly adding dichlorocarbenes to the nanotube sidewall, albeit in relatively low quantities (~2%).

Success at covalent sidewall derivatization of single-wall carbon nanotubes has been limited in scope, and the reactivity of the sidewalls has been compared to the reactivity of the basal plane of graphite (Aihara, J. Phys. Chem., 1994, 98:9773-9776). A viable route to direct sidewall functionalization of single-wall carbon nanotubes has been fluorination at elevated temperatures, which process was disclosed in a patent commonly assigned to the assignee of the present Application, U.S. Pat. No. 6,645,455, to Margrave et al. These functionalized nanotubes may either be de-fluorinated by treatment with hydrazine (or allowed to react with strong nucleophiles, such as alkyllithium reagents. See Mickelson et al., J. Phys. Chem. B, 1999, 103; 4318-4322; and Boul et al., Chem. Phys. Lett., 1999, 310:367-372, respectively.

Although fluorinated nanotubes may well provide access to a variety of functionalized materials, the two-step protocol and functional group intolerance to organolithium reagents may render such processes incompatible with certain, ultimate uses of the carbon nanotubes. Other attempts at sidewall modification have been hampered by the presence of significant graphitic or amorphous carbon contaminants. See Chen, Y. et al., J. Mater Res. 1998, 13:2423-2431. For some reviews on sidewall functionalization, see Bahr et al., J. Mater. Chem., 2002, 12:1952; Banerjee et al., Chem. Eur. J., 2003, 9:1898; Holzinger et al., Angew. Chem. Int. Ed., 2001, 40(21):4002-4005; Khabashesku et al., Acc. Chem. Res., 2002, 35:1087-1095; and Dyke et al., J. Phys. Chem. A, 2005, 108:11151-11159. Within the literature concerning sidewall-functionalization of SWNTs, however, there is a wide discrepancy of solubility values between reports. This is due to explicable variations in filtration methods.

A more direct approach to high degrees of functionalization of nanotubes (i.e., a one step approach and one that is compatible with certain, ultimate uses of the nanotubes) has been developed using diazonium salts and was disclosed in a co-pending application commonly assigned to the assignee of the present Application. See PCT publication WO 02/060812 by Tour et al., filed Jan. 29, 2002. Using pre-synthesized diazonium salts, or generating the diazonium species in situ, reaction with such species has been shown to produce derivatized SWNTs having approximately 1 out of every 20 to 30 carbons in a nanotube bearing a functional moiety.

Because of the poor solubility of SWNTs in solvent media, such processes require extraordinary amounts of solvent for the dissolution and/or dispersion of the SWNTs (~2 L/g coupled with sonication in most cases). See Bahr et al., Chem. Commun., 2000, 193-194. This problem of an inordinate amount of solvent makes covalent functionalization on the industrial scale economically infeasible. This has led to the development of solvent-free methods for the functionalization/derivatization of carbon nanotubes. See Dyke et al., J. Am. Chem. Soc., 2003, 125:1156-1157.

While the above-mentioned functionalization methods have enhanced the manipulability of carbon nanotubes (especially SWNTs), the use of functionalization/derivatization methods to produce novel composite materials and structures has not been fully explored. From the standpoint of the electronic/semiconductor industry, methods of anchoring and/or grafting carbon nanotubes to silicon or other surfaces would be highly advantageous, particularly where such anchoring and grafting is done without metal.

BRIEF DESCRIPTION OF THE INVENTION

The present invention is directed toward methods of attaching (anchoring) or grafting carbon nanotubes (CNTs) to silicon or other surfaces, wherein such attaching or grafting occurs via molecular linker species. In some embodiments, the molecular linker species are first attached to the CNTs to form functionalized CNTs, and these functionalized CNTs are then reacted with a silicon (Si) surface to form a CNT-Si composite structure. In other embodiments, Si surfaces are functionalized with molecular linker species that subsequently and/or simultaneously react with CNTs to form a CNT-Si composite structure. The present invention is also directed to the novel compositions produced by such methods.

In some embodiments, methods of attaching or grafting CNTs to surfaces involve Si surfaces, and such methods can generally be described as comprising the steps of: (1) dispersing CNTs in a solvent to form dispersed CNTs; (2) functionalizing at least some of the dispersed CNTs by reacting them with a quantity of at least one functionalizing agent to produce functionalized CNTs; and (3) assembling by attaching and/or grafting at least some of the functionalized CNTs to a Si surface, via chemistries involving their functional group moieties, to form a carbon nanotube-silicon (CNT-Si) composite structure.

In some or other embodiments, methods of attaching or grafting carbon nanotubes to surfaces involve silicon surfaces, and such methods can generally be described as comprising the steps of: (1) reacting a Si surface with a quantity of functionalizing agent to form a functionalized Si surface; (2) dispersing CNTs in a solvent to form dispersed CNTs; and (3) reacting the functionalized Si surface with the dispersed nanotubes to form a CNT-Si composite structure comprising CNTs molecularly grafted to a Si surface.

In some or other embodiments, the present invention is additionally or alternatively directed to nanotube-substrate compositions, particularly CNT-Si composite structures, made by any or all of the above-described methods. Such CNT-Si composite structures generally comprise at least one Si surface to which functionalized CNTs are covalently bound through the functionalizing material, or remnants thereof. Such CNT-Si composite structures are likely to have broad application in the electronics industry Accordingly, in some embodiments, the present invention provides for the covalent attachment of functionalized CNTs to Si. This allows for the introduction of CNTs onto all manner of Si surfaces and thereby introduction of CNTs covalently into silicon-based devices, onto silicon particles, and onto silicon surfaces. Although other methods exist to introduce CNTs into silicon-based devices (e.g., chemical vapor deposition), the methods of the present invention are uniquely selective for silicon and allow for the generation of working devices at much lower temperatures.

The foregoing has outlined rather broadly the features of the present invention in order that the detailed description of the invention that follows may be better understood. Additional features and advantages of the invention will be described hereinafter which form the subject of the claims of the invention.

BRIEF DESCRIPTIONS OF THE DRAWINGS

For a more complete understanding of the present invention, and the advantages thereof, reference is now made to the following descriptions taken in conjunction with the accompanying drawings, in which.

DETAILED DESCRIPTION

Figure 1:
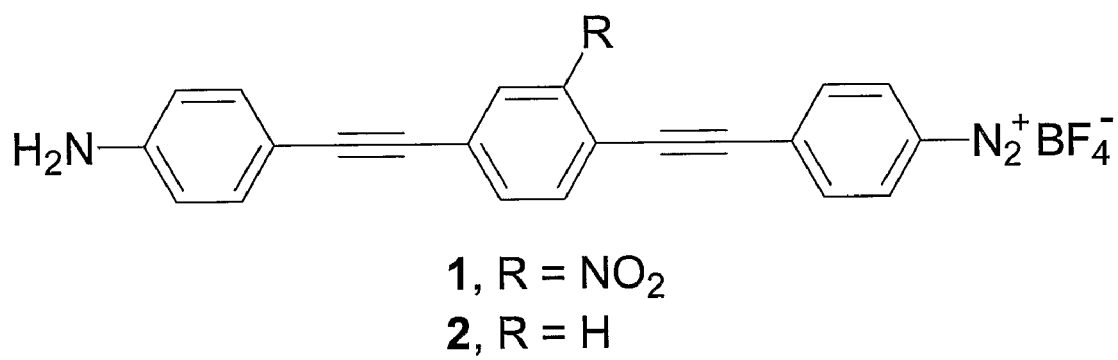
FIG. 1 depicts oligo(phenylene ethynylene)s 1 and 2 used to covalently attach SWNTs to silicon, in accordance with some embodiments of the present invention.

The present invention is directed toward methods of attaching or grafting carbon nanotubes (CNTs) to silicon (Si) or other surfaces, wherein such attaching or grafting occurs via molecular linker species bound to both the CNTs and the surface. The present invention is also directed to the novel compositions produced by such methods. Previous work by Applicants has demonstrated covalent attachment of arenes via aryldiazonium salts to Si (hydride-passivated single crystal or polysilicon; <111> or <100>, p-doped, n-doped or intrinsic), GaAs, and Pd surfaces (Stewart et al., J. Am. Chem. Soc., 2004, 126:370-378). In the case of Si, this provides a direct arene-Si bond with no intervening oxide. Applicants have also reported on the use of aryldiazonium salts for the direct covalent linkage of arenes to single wall carbon nanotubes (SWNTs), where the nanotubes can exist either as bundles or individual structures (when surfactant-wrapped). See Dyke et al., J. Phys. Chem. A, 2005, 108:11151-11159; and Dyke et al., Chem. Eur. J., 2004, 10:812-817. In some embodiments, the present invention is directed to a combination of these two technologies to afford the covalent attachment of individualized (unroped) SWNTs to Si surfaces.

In the following description, specific details are set forth such as specific quantities, sizes, etc. so as to provide a thorough understanding of embodiments of the present invention. However, it will be obvious to those skilled in the art that the present invention may be practiced without such specific details. In many cases, details concerning such considerations and the like have been omitted inasmuch as such details are not necessary to obtain a complete understanding of the present invention and are within the skills of persons of ordinary skill in the relevant art.

Carbon nanotubes (CNTs), according to the present invention, include, but are not limited to, multi-wall carbon nanotubes (MWNTs), single-wall carbon nanotubes (SWNTs), double-wall carbon nanotubes (MWNTs), small-diameter carbon nanotubes (having diameters less than ca. 3.5 nm), buckytubes, fullerene tubes, carbon fibrils, and combinations thereof. Such carbon nanotubes can be synthesized via a variety of routes and can be of a variety of lengths, diameters, chiralities (helicities), and purity. Such carbon nanotubes can be endohedrally-doped. Furthermore, the population of a CNT sample can be substantially homogeneous or inhomogeneous in terms of length, diameter, chirality, and/or electronic type. In some embodiments, efforts are taken to purify the nanotubes, and/or separate the nanotubes by type. See, e.g., Chiang et al., J Phys. Chem. B, 2001, 105:8297-8301; and Dyke et al., J. Am. Chem. Soc. 2005, 127:4497-4509; respectively. For a discussion of SWNT types, see Bachilo et al., Science, 2002, 298:2361-2366; and Weisman et al., Nano Lett., 2003, 3:1235-1238.

Silicon surfaces, according to the present invention, comprise Si selected from amorphous or polycrystalline silicon, single-crystal silicon (e.g., <111>, <100>, etc.), intrinsic silicon, polysilicon, amorphous silicon in specialized structures, and combinations thereof. Depending on the embodiments, the silicon can be doped (n-doped or p-doped) or undoped. Depending upon the particular embodiment, such Si surfaces can be of a form inclusive of, but not limited to, wafers, films, particles, coatings, and combinations thereof.

In some embodiments, referred to herein as "functionalized nanotube embodiments," methods of attaching or grafting CNTs to surfaces involve Si surfaces, and such methods can generally be described as comprising the steps of: (1) dispersing CNTs in a solvent to form dispersed CNTs, wherein the CNTs are dispersed as individuals, bundles, or combinations thereof; (2) functionalizing at least some of the dispersed CNTs by reacting them with a quantity of at least one functionalizing agent to produce functionalized CNTs; and (3) assembling by attaching and/or grafting at least some of the functionalized CNTs to a Si surface, via chemistries involving their functional group moieties, to form a carbon nanotube-silicon (CNT-Si) composite structure.

In some of the above-described functionalized nanotube embodiments, CNTs are dispersed in an aqueous medium with the aid of surfactants and/or polymer wrapping agents. Generally, at least some of these dispersed CNTs are dispersed as individual nanotubes. See O'Connell et al., Science, 2002, 297:593-596; O'Connell et al., Chem. Phys. Lett., 2001, 342:265-271; Hudson et al., J. Am. Chem. Soc., 2004, 126:11158-11159.

Functionalization of CNTs, as described herein, generally includes sidewall functionalization, tube end functionalization, and combinations thereof. Functionalization of CNTs, in accordance with the functionalized nanotube embodiments of the present invention, is typically carried out by reacting CNTs with a quantity of one or more substituted aryl diazonium species, as described previously. See PCT publication WO 02/060812 by Tour et al., filed Jan. 29, 2002; Bahr et al., J. Am. Chem. Soc., 2001, 123:6536-6542; Bahr et al., Chem. Mater., 2001, 13, 3823-3824; Dyke et al., J. Am. Chem. Soc., 2003, 125:1156-1157; Dyke et al., Nano Lett., 2003, 3:1215-1218; Strano et al., Science, 2003, 301:1519-1522; Dyke et al., SynLett., 2004, 155-160.

For the above-described functionalized nanotube embodiments, to covalently attach (graft) functionalized CNTs to a Si surface, the functionalized CNTs must possess at least some functional moieties capable of reacting, either directly or indirectly, with the Si surface. Depending on the embodiment, such attachment of the CNTs to the Si surface occurs through functional moieties attached to the CNT sidewalls and/or ends. In some such embodiments, the at least one functionalizing agent comprises an aryl diazonium species comprising a silyl-protected terminal alkyne that can be deprotected in situ. In some embodiments, to attach or graft the functionalized CNTs to a Si surface, the functionalized CNTs are purified and dispersed in a solvent other than that in which they were formed. These dispersed functionalized CNTs are then contacted with one or more Si surfaces to which they are reacted through their functional group moieties. When the dispersed functionalized CNTs comprise silyl-protected terminal alkyne moieties, they can be attached to a hydrogen-passivated Si surface via hydrosilation in the presence of a catalytic amount of triphenylcarbonium tetrafluoroborate (or other suitable catalyst). A general procedure (not involving CNTs) for making such attachments can be found in Stewart et al., J. Am. Chem. Soc., 2004, 126:370-378.

In some functionalized nanotube embodiments, by using one or more suitable lithographic and/or surface treatment techniques, CNTs can be attached or grafted to surfaces in structurally meaningful ways. Such directed attachment, especially to Si surfaces, could be used in the development and fabrication of micro- and/or nano-electronic devices. Suitable lithographic techniques include, but are not limited to, conventional photolithography, e-beam lithography, deep UV lithography, block copolymer lithography, imprinting, and combinations thereof.

In some or other embodiments, referred to herein as, "functionalized surface embodiments," methods of attaching or grafting carbon nanotubes to surfaces involve silicon surfaces, and wherein such methods can generally be described as comprising the steps of: (1) reacting a Si surface with a quantity of functionalizing agent to form a functionalized Si surface; (2) dispersing CNTs in a solvent to form dispersed CNTs (as individual nanotubes, ropes or bundles, or mixtures thereof); and (3) reacting the functionalized Si surface with the dispersed nanotubes to form a CNT-Si composite structure comprising CNTs molecularly grafted to a Si surface.

Analogous to the functionalized nanotube embodiments, in the functionalized surface embodiments, the step of reacting Si surfaces with functionalizing agent typically involves a hydride-passivated (H-passivated) Si surface. Such H-passivated Si surfaces can then be reacted with substituted aryl diazonium salts. See Stewart et al., J. Am. Chem. Soc., 2004, 126:370-378.

In some functionalized surface embodiments, the step of reacting a Si surface is carried out in a solvent selected from the group consisting of aqueous solvents, organic solvents, supercritical solvents, and combinations thereof. In some embodiments, the step of reacting is carried out in the presence of HF, so as to provide for a continual hydride passivation of the Si surface.

In some functionalized surface embodiments, at least some of the CNTs are at least partially functionalized (on their sidewalls, ends, or both) prior to the step of reacting them with the functionalized Si surface. In some instances, this partial functionalization facilitates the dispersing of the CNTs. In some embodiments, the CNTs are dispersed in a solvent selected from the group consisting of aqueous solvents, organic solvents, supercritical solvents, and combinations thereof. In some embodiments, during the step of dispersing, a dispersal agent is used to facilitate the dispersing, wherein said dispersal agent is selected from the group consisting of surfactants, polymers operable for wrapping the CNTs, and combinations thereof. Once dispersed, these CNTs can then be reacted with the functionalized Si surface.

Depending on the embodiment, attachment of the CNTs to the Si surfaces can involve attachment between the Si surface and CNT sidewalls and/or ends via molecular linker species. In some functionalized surface embodiments, covalent attachment of individualized (unroped) and/or bundled (roped) SWNTs (or generally any CNT) to Si surfaces is provided via orthogonally functionalized oligo(phenylene ethynylene) (OPE) aryldiazonium salts. See Kosynkin et al., Org. Lett., 2001, 3:993-995; Kosynkin et al, Mater. Res. Soc. Symp. Proc., 2001, 660:JJ3.5.1-JJ3.5.5; Flat et al., J. Org. Chem., 2004, 69:1752-1755; Pollack et al., Langmuir, 2004, 20:1838-1842; Hickman et al., Langmuir, 1992, 8:357-359; Gardner et al., J. Am. Chem. Soc., 1995, 117:6927-6933; and Walker et al., J. Am. Chem. Soc., 2004, 126:16330-16331. In addition to functioning as the linker units, OPEs and related conjugated molecules can serve as electronically-active moieties in sensor and device embodiments (Tour, J. M. *Molecular Electronics: Commercial Insights, Chemistry, Devices, Architecture and Programming*; World Scientific: River Edge, N.J., 2003). Hence, the union of easily patterned silicon with the often hard-to-affix nanotubes can provide a critical interface methodology for electronic and sensor arrays.

In some functionalized surface embodiments, chemical orthogonality provides chemoselection for dual substrate/nanotube attachment while OPEs provide a rigid structure to minimize molecular looping upon surfaces. Target OPE molecules typically comprise a diazonium salt on one end and an aniline moiety on the other end, as in the exemplary compounds shown in FIG. 1 (compounds 1 and 2). Referring to Scheme 1 (FIG. 2), this design allows for selective assembly via the first diazonium salt onto a hydride-passivated silicon surface followed by diazotization of the aniline using an alkyl nitrite. Once formed, the new diazonium salt, covalently bound to the Si surface, will react with an aqueous solution of individualized sodium dodecylsulfate (SDS)-wrapped SWNTs (O'Connell et al., Science, 2002, 297:593-596) (SWNT/SDS) resulting in covalent attachment of the SWNTs (Dyke et al., Nano Lett., 2003, 3:1215-1218) to the silicon surface using the OPEs, as shown in Scheme 1.

Figure 13:
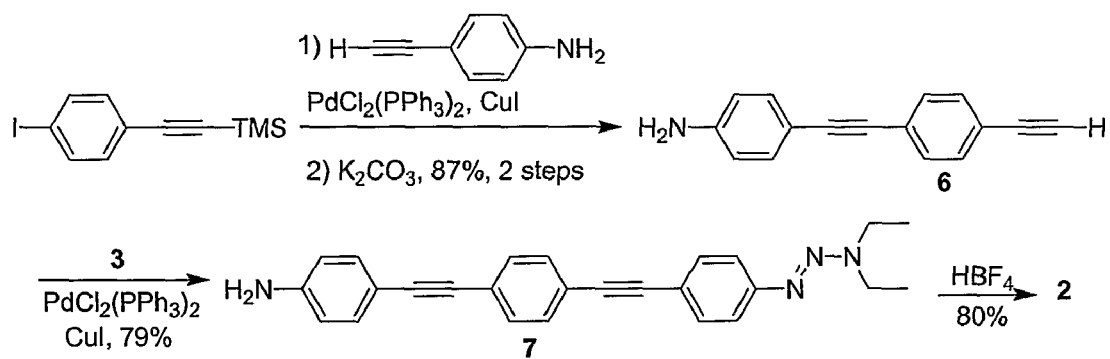
FIG. 13 (Scheme 7) depicts the synthesis of compounds 7 and 2, in accordance with some embodiments of the present invention.

In some functionalized surface embodiments, the OPE is synthesized via a triazene intermediate. The key to developing an orthogonal attachment chemistry is the formation of a diazonium species with a latent diazonium salt at the other end. An α-dialkyltriazenyl-ω-aniline is suitable in that it has been demonstrated that the triazene can be converted to a diazo species without affecting the aniline (Kimball et al., Angew. Chem. Int. Ed., 2002, 41:3338-3351). The synthesis of the mononitro compound 1 is shown in Scheme 2 (FIG. 3) and compound 2 was similarly synthesized. See Example 4(b) and Scheme 7 (FIG. 13). Indeed, the triazene moiety on 5 was readily converted to the diazonium salt upon treatment with $HBF_4$ while the aniline remained intact; the latter thereby serving as a masked (i.e., latent) diazonium salt ready for generation after surface attachment. In some embodiments, by using aqueous HF as the triazene-to-diazonium conversion promoter, the entire process can be carried out in air since any Si-oxide so formed is continuously converted to the Si—H species.

As in the case of some functionalized nanotube embodiments, in some functionalized surface embodiments, by using one or more suitable lithographic and/or surface treatment techniques, CNTs can be attached or grafted to surfaces in structurally meaningful ways. Such directed attachment, especially to Si surfaces, could be used in the development and fabrication of micro- and/or nano-electronic devices.

The present invention is also directed to nanotube-substrate compositions, particularly carbon nanotube-silicon composite structures, made by the above-described methods.

Such CNT-Si composite structures comprise at least one silicon surface to which functionalized CNTs are covalently bound through the functionalizing material (agent), or remnants thereof (molecular linker species). Generally, such attachment of the CNTs to the Si surface is provided by molecular linkers attached to the sidewalls and/or ends of the nanotubes. Such CNT-Si composite structures are likely to have broad application in the electronics industry (vide infra).

An immediate use for the methods of the present invention is in the covalent attachment of CNTs onto silicon, wherein such methods allow for the attachment of individual and/or bundles of CNTs to Si surfaces. This allows for the introduction of CNTs into silicon-based devices. The current state of the art approach is to grow CNTs by a chemical vapor deposition (CVD) process so as to introduce them into devices simultaneous to their growth. Typical temperatures necessary for the CVD processes are in the neighborhood of 800° C. Using the methods described herein, the highest temperature required to regenerate the pristine (unfunctionalized) CNTs is 450° C.—should it be desirable to remove the chemical functionality and/or molecular linkages between the CNT and the associated Si surface.

Variability within the above-described embodiments include, but are not limited to: the way in which the nanotubes are dispersed (note that in some embodiments, the CNTs can be reacted neat, without first dispersing in solvent); the kinds, types, and amount of functional groups appended to the nanotube; the type of silicon (e.g., <111>, <100>, n-doped, p-doped or intrinsic silicon, single crystal silicon or polysilicon such as those in MEMS- and NEMS-based (micro- and nano-electromechanical systems) devices; the use of surfaces other than silicon; the assembly methodology; and the types of structures and devices made by the processes of the present invention. Combinations of the functionalized nanotube embodiments and the functionalized surface embodiments are also possible. Additionally, in some embodiments, the Si surface bears a thin oxide coating to serve as a Schottky barrier, as is often used in electronics.

The following Examples are provided to demonstrate particular embodiments of the present invention. It should be appreciated by those of skill in the art that the methods disclosed in the Examples which follow merely represent exemplary embodiments of the present invention. However, those of skill in the art should, in light of the present disclosure, appreciate that many changes can be made in the specific embodiments described and still obtain a like or similar result without departing from the spirit and scope of the present invention.

EXAMPLE 1

This Example serves to illustrate how one type of CNT, single-wall carbon nanotubes (SWNTs), can be covalently attached to silicon surfaces.

Figure 4:
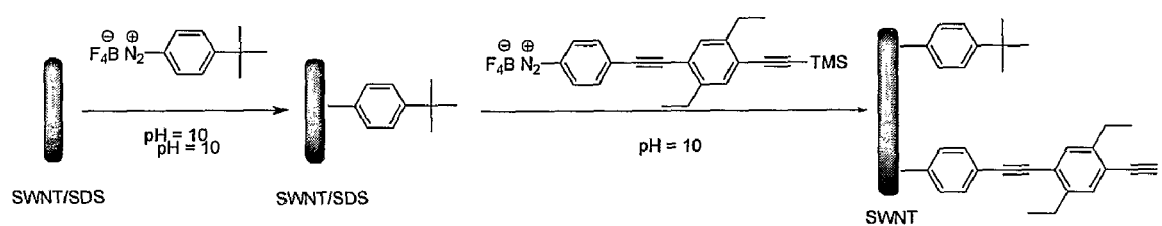
FIG. 4 (Scheme 3) depicts generation of material that can be covalently attached to silicon, in accordance with functionalized nanotube embodiments of the present invention.
Figure 5:
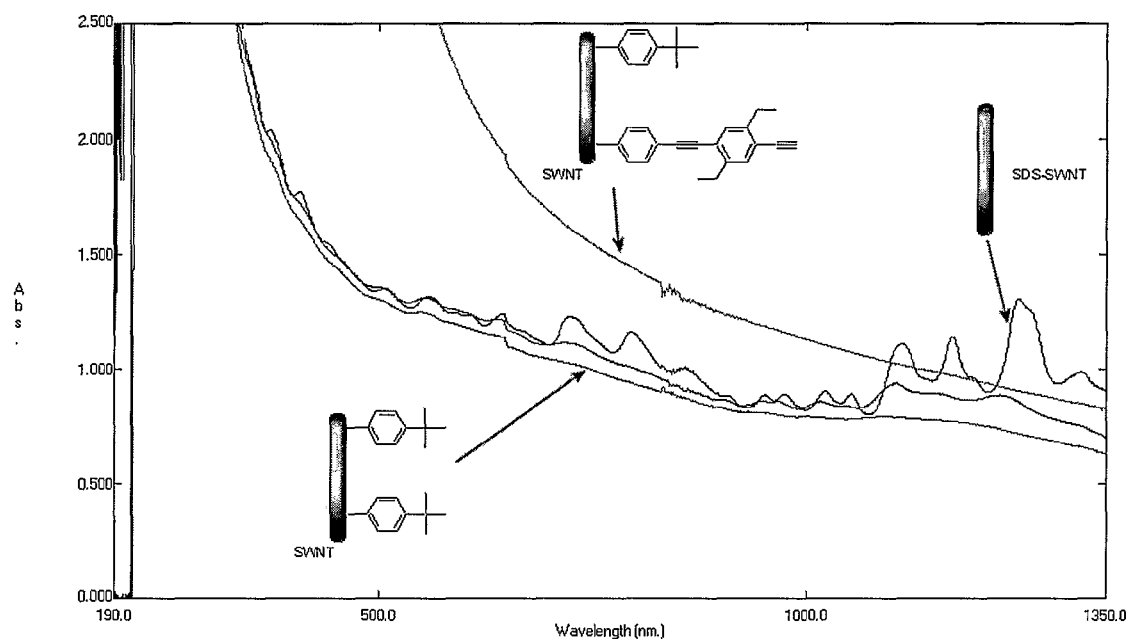
FIG. 5 illustrates how UV-vis-NIR spectroscopy can be used to assure direct covalent functionalization of SWNTs, in accordance with some embodiments of the present invention.

Single-walled carbon nanotubes were dispersed as individuals in an aqueous surfactant solution according to a published procedure (for the formation of individuals in water with surfactants see O'Connell et al., Science, 2002, 297: 593). These dispersed SWNTs were then functionalized according to another published procedure (for functionalization of carbon nanotubes dispersed as individuals in water see Dyke et al., Nano Lett., 2003, 3:1215). Accordingly, the dispersed SWNTs were first treated with 4-tert-butylbenzenediazonium tetrafluoroborate (see FIG. 4, Scheme 3) to give increased solubility (i.e., to provide for a solution of functionalized SWNTs) to the carbon nanotubes. A second group was then attached to the sidewall of the nanotube having a silyl-protected terminal alkyne that is ultimately deprotected in situ. This gave a soluble carbon nanotube that has functional groups appended to the sidewall that can be attached covalently to silicon. This reaction to yield functionalized SWNTs bearing such silyl-protected terminal alkyne moieties was monitored by ultraviolet-vis-near infrared (UV-vis-NIR) spectroscopy to assure direct covalent functionalization (FIG. 5).

Figure 6:
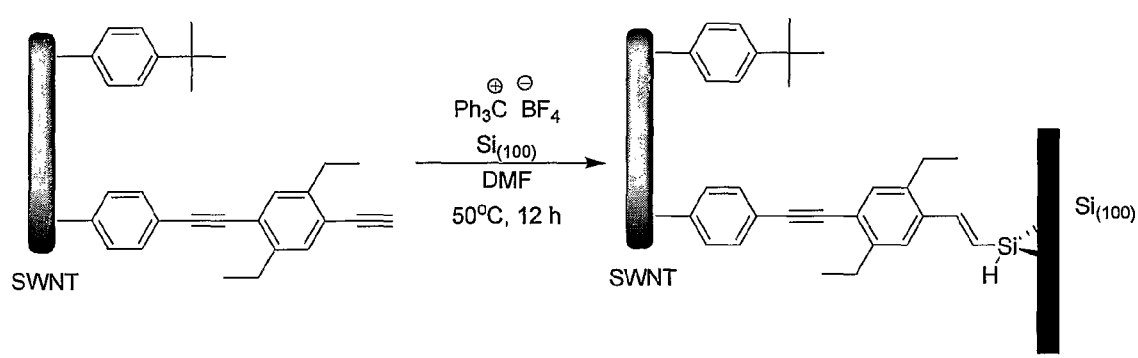
FIG. 6 (Scheme 4) depicts covalent attachment of functionalized SWNTs to Si <100>, in accordance with some embodiments of the present invention.
Figure 7:
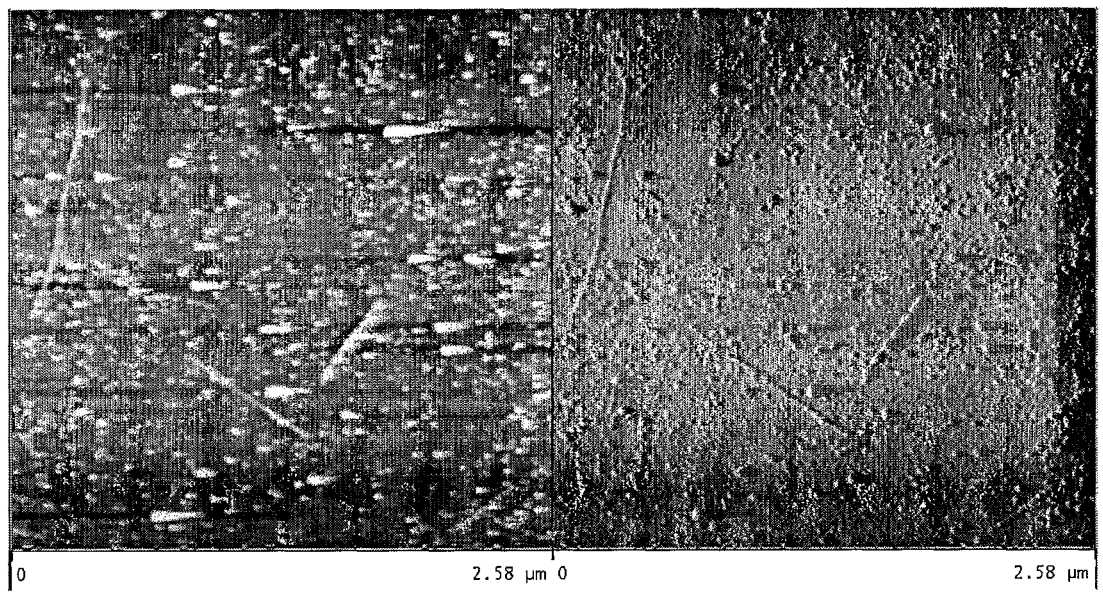
FIG. 7 illustrates an assembly of SWNTs covalently attached to a silicon surface, as characterized by atomic force microscopy (AFM), and in accordance with some embodiments of the present invention.

Once the reaction to form the appropriately-functionalized carbon nanotubes (SWNTs bearing silyl-protected terminal alkyne moieties) was complete, the nanotube solution was passed through a plug of glass wool to remove any undesirable particulates. This filtered solution was then flocculated by diluting with acetone, and filtered through a TEFLON membrane. The collected solid (the purified, functionalized CNTs) was then dispersed in DMF with ultrasonication and filtered once again through a TEFLON membrane. The functionalized material was then dispersed in dry DMF and assembled onto (i.e., covalently attached to) silicon (FIG. 6, Scheme 4) by hydrosilation. The assembly was conducted by treating the nanotube solution with a catalytic amount of triphenylcarbonium tetrafluoroborate and submersing a hydrogen-passivated silicon sample in the solution (for H-passivation procedure, see Stewart et al., J. Am. Chem Soc., 2004, 126:370-378, and references therein for the hydrosilylation protocols). The assembly mixture was then agitated with warming for 12 hours. After such time, the functionalized silicon sample was rinsed with organic solvent and dried with a stream of nitrogen. The assembly was characterized by atomic force microscopy (AFM) (FIG. 7).

Figure 8:
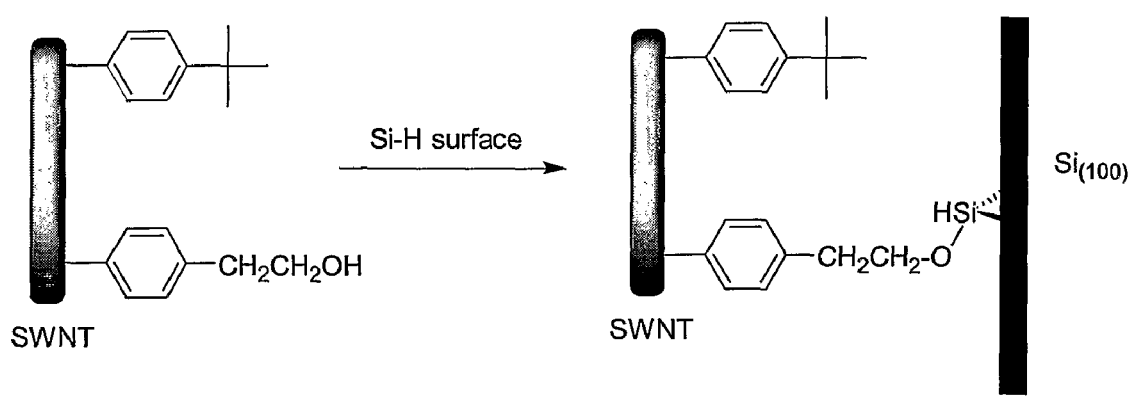
FIG. 8 (Scheme 5) depicts attachment of SWNTs to a Si surface via heteroatom-containing functional groups, in accordance with some embodiments of the present invention.

Another method for attachment of these functionalized nanotubes to H-passivated silicon can be via functionalization of the nanotubes with diazonium species (e.g., diazonium salts) that permit attachment to a hydrogen passivated silicon surface via Si—O— or Si—S— linkages. For example, functionalizing SWNTs with —$C_6H_4$—$CH_2CH_2OH$ would permit direct O-attachment to the Si surface. See Scheme 5 (FIG. 8). Similarly, an S-attachment to a H-passivated Si surface could be effected by using, for example, SWNTs functionalized with —$C_6H_4$—SH.

EXAMPLE 2

This Example serves to illustrate the formation of a CNT-Si composite structure in accordance with some functionalized surface embodiments of the present invention.

A quantity of diazonium salt 1 or 2 (FIG. 1) in anhydrous acetonitrile ($CH_3CN$, 2.0 mM) was exposed to a hydride-passivated silicon <111> surface, according to a previous report, in a nitrogen-filled glove box for a desired reaction time (Stewart et al., J. Am. Chem. Soc., 2004, 126:370-378). Following monolayer assembly, the substrate (functionalized Si surface) was removed from the glove box and placed in a 0.3 M solution of isoamylnitrite in $CH_3CN$ for 5 minutes to diazotize the terminal aniline (FIG. 2, Scheme 1). The substrate was then removed and immediately immersed in an aqueous SWNT/SDS suspension (O'Connell et al., Science, 2002, 297:593-596) (0.7 μM) at pH 10 for 24 hours. The SWNT remained predominantly as individualized SWNTs rather than as bundles. Following nanotube attachment, the substrate was removed, rinsed with water, $CH_3CN$ and dried with a stream of nitrogen to afford the desired CNT-Si composite structure (Scheme 1).

TABLE 1

| Molecule | Thickness (nm) | |
| --- | --- | --- |
| | found[a] | calcd[b] |
| 1 | 2.0[c] | 1.9 |
| 2 | 1.4[c], 2.1[d] | 1.9 |

Molecular attachment to the Si substrate was analyzed using ellipsometry, the results of which are shown in Table 1. Table 1 shows calculated and observed thicknesses of 1 and 2 on Si <111>, wherein "a" denotes that the value was measured by ellipsometry with ca.±0.2 nm error; "b" denotes that the theoretical thickness was calculated by molecular mechanics (not including the arene-silicon bond); "c" denotes that the assembly was performed inside a nitrogen filled glove box for 1 hour; "d" denotes that the assembly was performed inside a nitrogen filled glove box for 16 hours; and wherein all reported values are an average of three measurements for reactions of a 2.0 mM solution of diazonium salt in $CH_3CN$. Monolayer formation for 1 reached the theoretical height after 1 hour. However, monolayer thicknesses for 2 averaged slightly below the theoretical SAM thickness, although thicknesses close to the theoretical value were attained by reacting the substrate with a solution of 2 for longer time periods.

Figure 9:
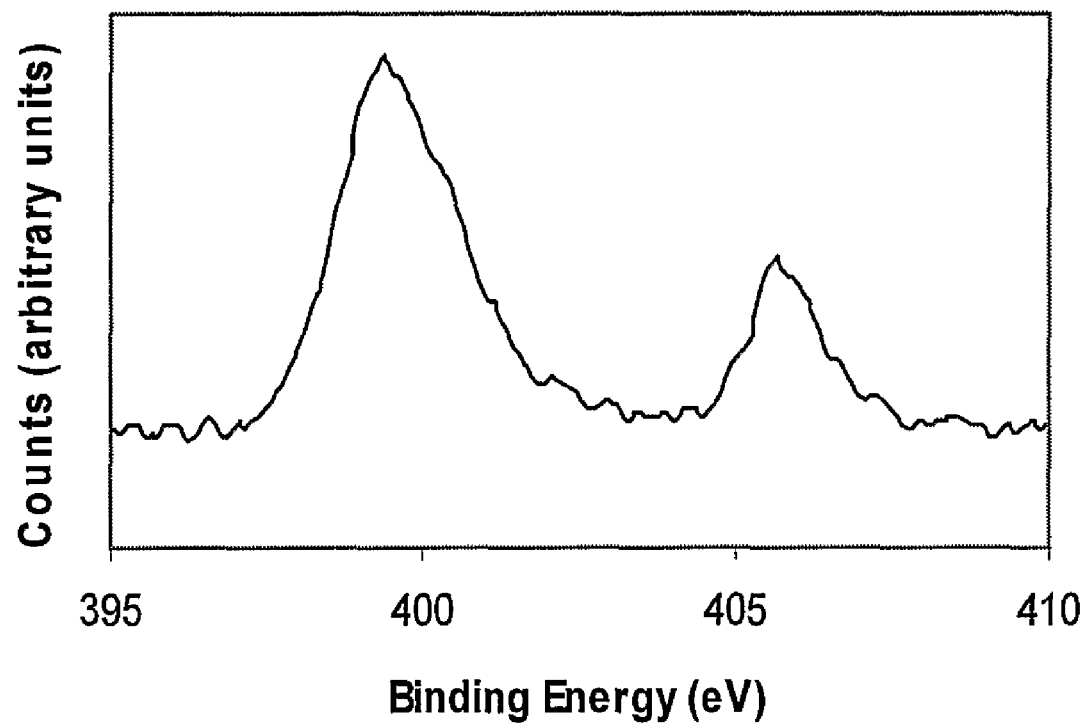
FIG. 9 is an XPS spectrum of the N 1s region of a SAM of compound 1, measured with a 45° take off angle.

FIG. 9 shows an X-ray photoelectron spectroscopy (XPS) spectrum of the N 1s region of a monolayer of 1. The smaller peak at 405.8 eV is due to the nitrogen atom of the nitro group and the peak at 399.7 eV is due to the aniline plus nitrogen gas adsorbed from the atmosphere. Attempts to measure the nitrogen signal of the surfaced-tethered diazonium salt were unsuccessful due to its rapid decomposition in air during transfer.

Figure 10:
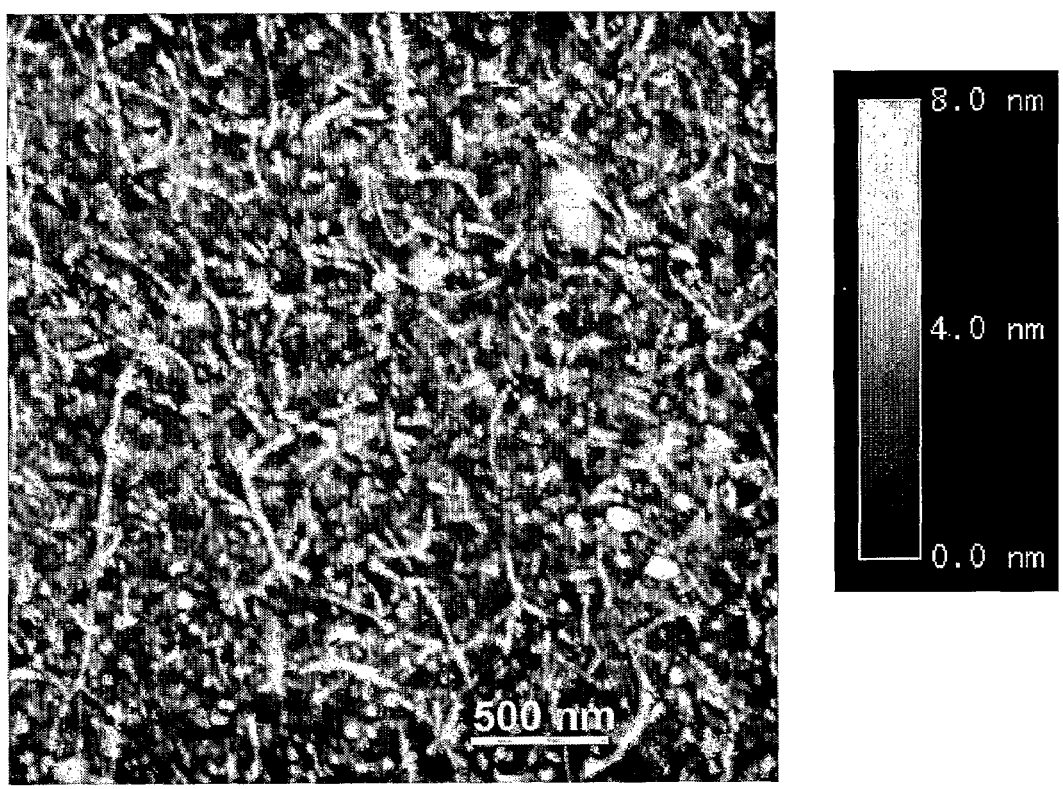
FIG. 10 is a tapping mode AFM image depicting SWNTs covalently bound via 1 to a silicon surface, in accordance with some embodiments of the present invention.

SWNT attachment was further verified using atomic force microscopy (AFM) (FIG. 10). As seen in FIG. 10, the AFM image shows a high coverage of SWNTs bound to the silicon substrate via the OPE molecules. The architectures are highly robust and able to withstand rinsing and 1 minute of ultrasonication. Many surface-bound nanotubes exist as individuals, although there may be small bundles present as well. While the nanotube diameters range from 0.9-3.1 nm, as recorded by the height measurements, they can be difficult to precisely ascertain due to their projection upward off the molecule-grafted surface.

Figure 14:
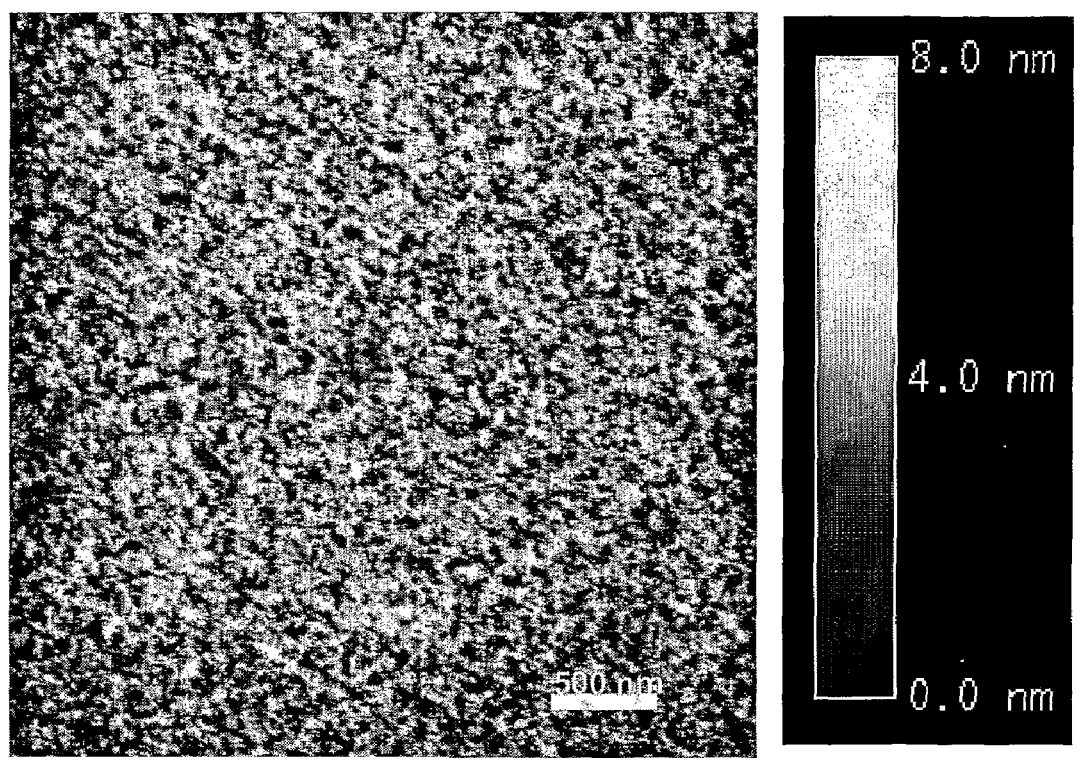
FIG. 14 is a control AFM image (in contrast to FIG. 12) obtained when the isoamylnitrite diazotization reaction of the terminal aniline is not employed, wherein few (if any) SWNTs are seen on the surface.

Control experiments were performed to verify that both the OPE and diazotization steps were required for SWNT attachment. When the OPE was not employed, or when the second diazotization step was eliminated, there was no attachment of the SWNTs to the silicon surface, as shown in the AFM images of FIG. 14. This leads to the conclusion that the SWNTs are indeed covalently attached to the assembled organic molecule via the in situ-generated diazonium salt. See Dyke et al., Nano Lett., 2003, 3:1215-1218.

It is important to note that when using $NOBF_4$ to perform the above diazotization (as opposed to the alkylnitrite) on the assembled monolayer, surface roughening occurred in the form of large peaks and valleys (10-20 nm), and the number of surface-bound nanotubes was reduced. This is because surfactant-wrapped SWNTs in water are being used, and $NOBF_4$ decomposes in water. However, as shown in a subsequent example, if the reaction is run in the absence of water, $NOBF_4$ in anhydrous solvent can be used as a diazotization agent; the SWNTs in that procedure are t-butylphenyl-functionalized and are therefore suspendable as individual tubes in the anhydrous organic solvent.

The lightly functionalized surface-bound SWNTs are likely to retain significant degrees of their electronic and optical properties since it takes functionalization of ca. 1 in 100 carbons along a SWNT to cause a loss of the sensitive UV van Hove singularities (Dyke et al., J. Am. Chem. Soc., 2005, 127:4497-4509). Furthermore, when applied only to the end-segments of SWNTs that straddle patterned gap arrays, the active central portions of the SWNTs will remain unperturbed by the surface hybridization moieties. Thus, this Si-nanotube assembly strategy could provide the basis for directing SWNTs to precise junctions in electronic, optical and sensor arrays.

EXAMPLE 3

This Example serves to illustrate the covalent attachment of SWNTs to a Si <100> surface via a surface functionalization embodiment, wherein the Si surface functionalization is carried out in the presence of hydrofluoric acid (HF), and wherein the CNTs are pre-functionalized for improved dispersability as individual nanotubes.

In this Example, organic arenes are covalently grafted to hydride-passivated Si <100> surfaces (Si—H) by the in situ conversion of aryldiethyltriazene 7 (FIG. 13) into a diazonium salt using dilute aqueous HF. Reactive diazonium species need not be isolated, and by using aqueous HF in the reaction medium, the entire process can be carried out in air since any Si-oxide is continuously converted to the Si—H species. Therefore, the process is compatible with simple organic device fabrication methods and paves the way for diverse silicon-molecule studies in, for example, molecular electronics, sensors, and photo-electrochemical-based conversion arrays. Additionally, it is shown in this Example that the aryltriazene 7 grafting to Si—H can be used in sequence with a selective aniline-to-diazonium conversion for the bridging of SWNTs to Si surfaces via the molecular layer.

Silicon <100> shards (prime grade, As doped) were cleaned in piranha solution (2:1 $H_2SO_4$:$H_2O_2$) at 100° C. for 30 minutes, and then rinsed with pure water (resistivity>18 MΩ cm$^{-1}$). The shards were immersed in etching solution, a mixture of 4% aqueous HF and $CH_3CN$ (v:v, 1:1; hence 2% HF overall), for 5 minutes under an Ar atmosphere. Organic triazenes were dissolved in 10 mL $CH_3CN$ before being added to the etching solution containing the Si <100> wafer. The reaction vessel was sealed with a fitted lid, and the container was agitated on a platform shaker at 100 rpm. After the reaction, the substrates were copiously rinsed with deionized $H_2O$ and $CH_3CN$, then dried with a stream of $N_2$.

The film thickness was measured using a single wavelength (632.8 nm laser) Gaertner Stokes ellipsometer. The n and k values were taken for each substrate. The thickness was modeled as a single absorbing layer on the top of an infinitely thick substrate (fixed $n_s$). A Quantera X-ray Photoelectron Spectroscopy (XPS) scanning microprobe was used in collecting the XPS data; the takeoff angle was 45°, and a 114.8 W monochromatic Al X-ray source was used for all the measurements. All XPS peaks were referenced to the major C 1s peak at 284.5 eV.

Functionalized SWNTs were prepared by treating 600 mL of an SDS suspension of SWNTs (40 mg/L, 0.024 g, 2.0 milliequiv. C) with 4-t-butyldiazobenzene tetrafluoroborate (0.992 g, 4.0 mmol). The pH of the solution was adjusted to ca. 10 with 6 M NaOH, at which point the mixture was allowed to stir for 3 hours. After completion of the reaction, the mixture was diluted with acetone and filtered over a polycarbonate membrane (1 μm pore size). The resulting filter cake was washed with water (100 mL) and acetone (200 mL), and then dried (30 mg). The TGA mass loss was 31.5%. The Raman "D" to "G" band ratio was 0.30.

Figure 11:
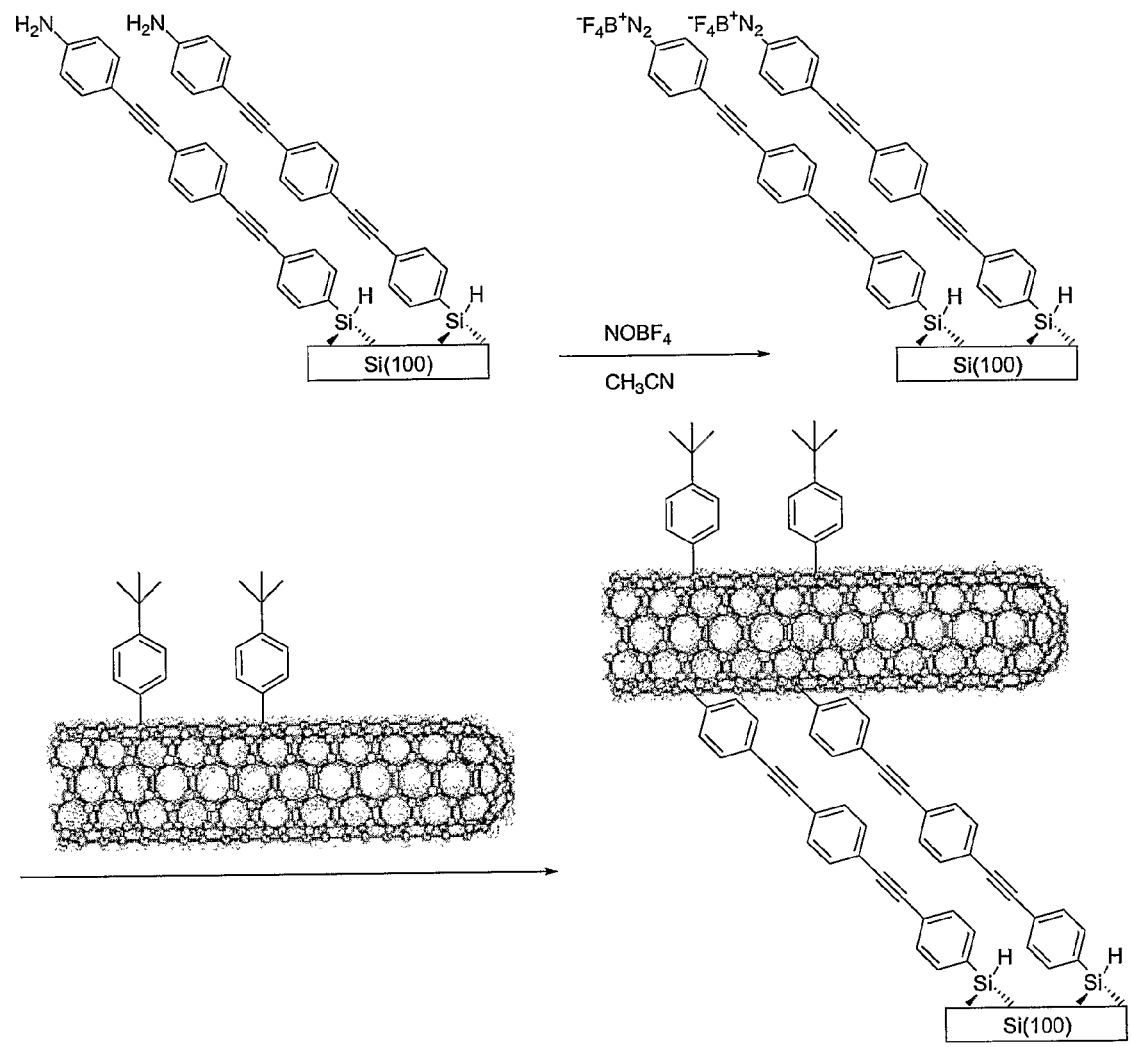
FIG. 11 (Scheme 6) depicts assembly (via covalent attachment) of the functionalized SWNTs onto the film derived from 7 on Si <100>, in accordance with some embodiments of the present invention.
Figure 12:
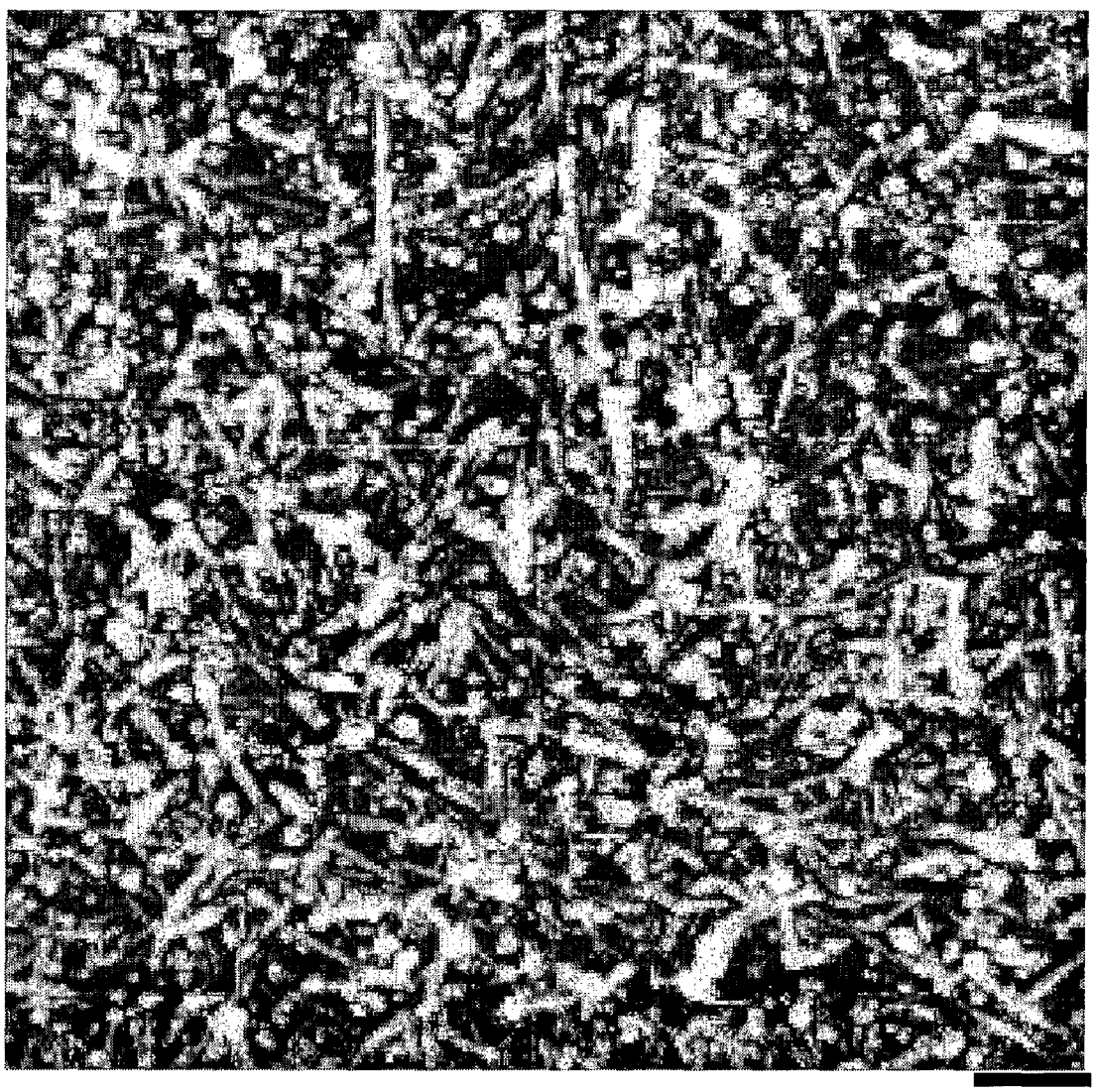
FIG. 12 is an AFM image of SWNTs covalently bound to the organic thin film derived from 7 on the silicon surface, wherein the heights of the SWNTs range from 0.8 nm to 3.2 nm, and wherein the black bar in the lower right=100 nm.

As mentioned above, organic triazene 7, bearing the aniline group on one end and the triazene moiety on the other, was assembled on the hydride-passivated Si surface to form a functionalized Si surface. Following assembly, the silicon shard was immersed in a dilute solution of t-butylphenyl-functionalized SWNTs in chloroform. An $NOBF_4$ solution (0.5 mM, 5 mL) in anhydrous acetonitrile was then added to the mixture containing the silicon shard; the $NOBF_4$ converted the aniline moiety into the diazonium salt in situ, and the SWNTs reacted with the diazonium functionality (Scheme 6, FIG. 11). After 30 minutes, the sample was removed, rinsed with acetonitrile and chloroform, and dried using a stream of $N_2$. A Digital Instruments Nanoscope IIIa tapping mode instrument was used to obtain AFM images of the covalently-attached SWNTs. The AFM image of the SWNT-aryl-Si assembly formed from triazene 7 (FIG. 13, Scheme 7) is shown in FIG. 12. It can be seen in FIG. 12 that the substrate surface is well-covered with SWNTs.

Based on the height measurement in the AFM (FIG. 12), it can be determined that the nanotubes are most likely individuals or small bundles with heights ranging from 0.8 nm to 3.2 nm. Since the silicon surface itself is not flat after the in situ film assembly process, with increases in roughness due to the layer of organic film, and the fact that $NOBF_4$ slowly etches silicon surfaces (as shown by control tests), some of the tubes may be extending out of the surface plane. In other cases, there may be molecules or other nanotubes underneath the SWNTs yielding a higher apparent height. The surface-bound SWNTs were stable to rinsing and short ultrasonication times (30 seconds) in a solvent. Control experiments were performed to ensure that the $NOBF_4$ diazotization step was required for SWNT attachment. Indeed, when the $NOBF_4$ diazotization step was eliminated, there was no attachment of the SWNTs to the silicon surface. Therefore, the junctions prepared from silicon-molecule-SWNTs could prove to be excellent non-metallic molecular electronic interfaces.

EXAMPLE 4

Figure 2:
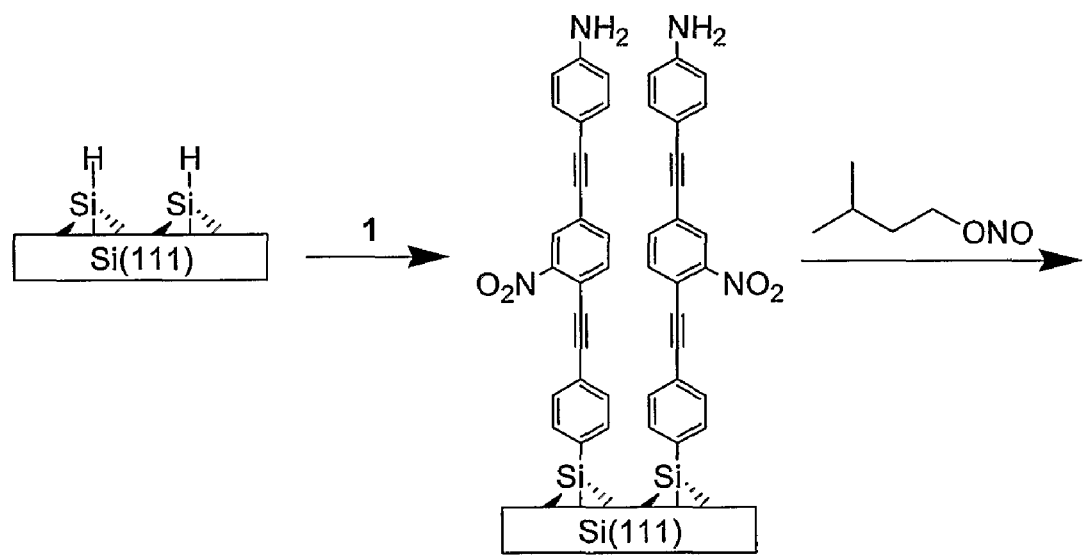
FIG. 2 (Scheme 1) depicts a stepwise attachment of carbon nanotubes to silicon via 1, in accordance with some embodiments of the present invention.
Figure 2:
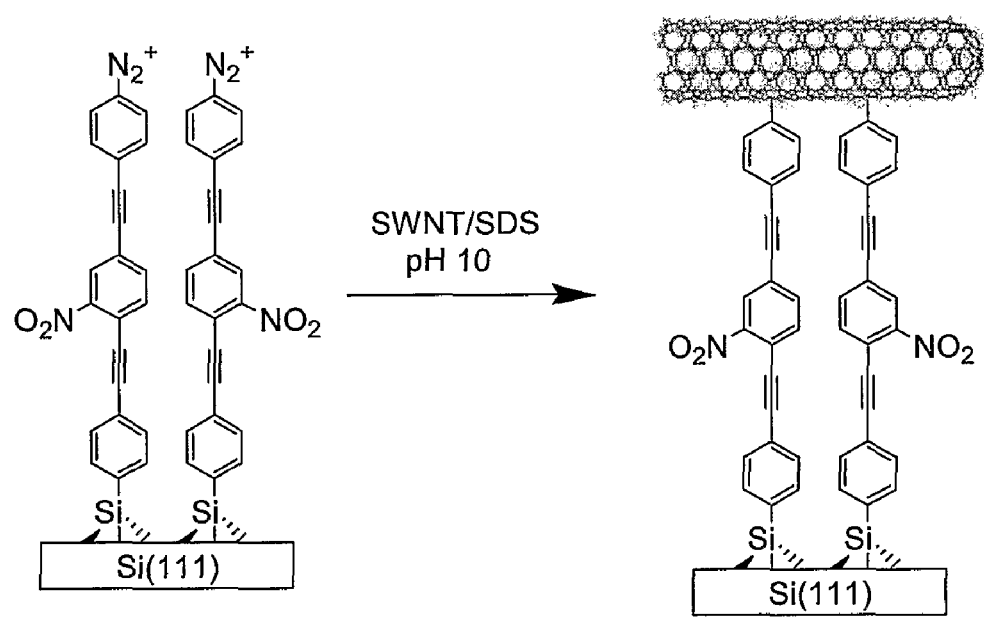
Figure 3:
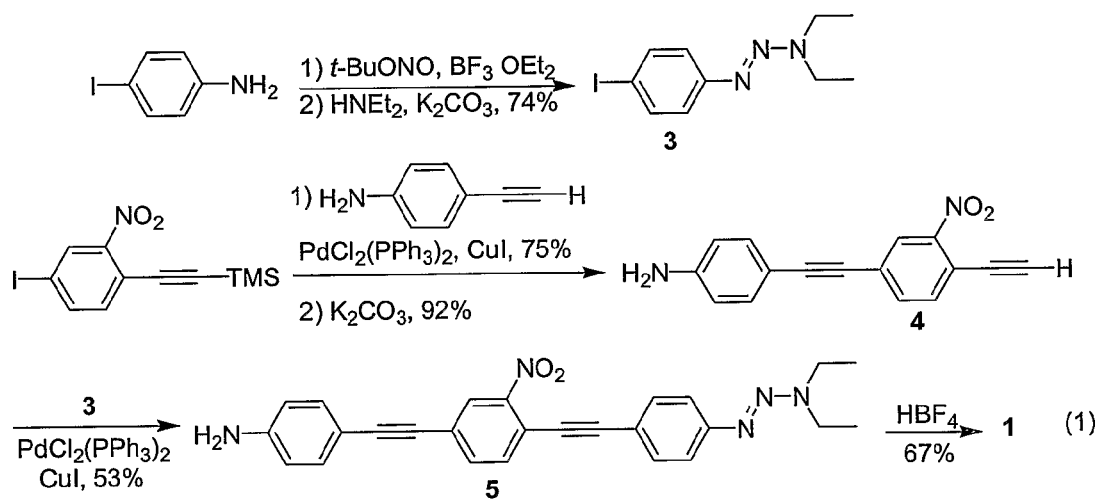
FIG. 3 (Scheme 2) depicts the formation of 1, in accordance with some embodiments of the present invention.

This Example serves to illustrate the synthesis of compounds 1-7, as shown in FIG. 1, FIG. 3 (Scheme 2), and FIG. 13 (Scheme 7).

EXAMPLE 4(A)

Synthesis of 1: 4-[4-(4-Amino-phenylethynyl)-2-nitro-phenylethynyl]-benzenediazonium tetrafluoroborate Compound 5 (0.10 g) was dissolved in THF (20 mL). Tetrafluoroboric acid (48% in water) (0.20 mL) was added dropwise. The mixture turned red and was stirred for 2 min. $Et_2O$ (50 mL) was added and a yellow precipitate formed. The mixture was filtered and washed with excess $Et_2O$ under a stream of nitrogen gas to afford 1 (0.07 g, 67%). FTIR (KBr) 3418, 2819, 2574, 2264, 2211, 1574, 1541, 1513, 1346, 1077, 838, 523 $cm^{-1}$. $^1$H NMR (400 MHz, $(CD_3)_2CO$) δ 8.95 (d, J=9.0 Hz, 2H), 8.42 (s, 1H), 8.25 (d, J=9.0 Hz, 2H), 8.05 (s, 2H), 7.92 (d, J=8.6 Hz, 2H), 7.72 (d, J=8.6 Hz, 2H). Attempts to acquire $^{13}$C NMR spectral information were unsuccessful due to the instability of compound 1 in solution for extended time periods.

EXAMPLE 4(B)

Synthesis of 2: 4-[4-(4-Amino-phenylethynyl)-phenylethynyl]-benzenediazonium tetrafluoroborate Compound 7 (0.12 g) was dissolved in THF (10 mL). Tetrafluoroboric acid (48% in water) (0.20 mL) was added dropwise. The mixture turned red and was stirred for 2 min. $Et_2O$ (50 mL) was added and a yellow precipitate formed. The mixture was filtered and washed with excess $Et_2O$ to afford 2 (0.10 g, 80%). FTIR (KBr) 3440, 2849, 2576, 2270, 2208, 1574, 1516, 1079, 837, 523 $cm^{-1}$. $^1$H NMR (500 MHz, $(CD_3)_2CO$) δ 8.90 (d, J=9.1 Hz, 2H), 8.21 (d, J=9.1 Hz, 2H), 7.85 (d, J=8.7 Hz, 2H), 7.76 (d, J=8.5 Hz, 2H), 7.72 (d, J=8.5 Hz, 2H), 7.69 (d, J=8.7 Hz, 2H). Attempts to acquire $^{13}$C NMR spectral information were unsuccessful due to the instability of compound 2 in solution for extended time periods.

EXAMPLE 4(C)

Synthesis of 3: 1-(4-Iodophenyl)-3,3-diethyltriazene (Holmes et al., Synth. Commun., 2003, 33:2447-2462)

4-Iodoaniline (5.00 g, 22.83 mmol) was added to a 250 mL round bottom flask. THF (25 mL) was added and the reaction was cooled to −30° C. Borontrifluoride diethyletherate (11.57 mL, 91.32 mmol) was added dropwise followed by the dropwise addition of t-butylnitrite (9.50 mL, 79.91 mmol). The reaction was warmed to room temperature and $Et_2O$ (150 mL) was added. The mixture was vacuum filtered and washed with $Et_2O$ to afford the aryl diazonium salt which was dissolved in $CH_3CN$ (80 mL) and cooled to 0° C. A solution of $H_2O$ (40 mL), $K_2CO_3$ (8.34 g, 60.41 mmol), and diethylamine (4.20 mL, 40.27 mmol) was added to the reaction which subsequently turned deep red. The mixture was allowed to warm to room temperature over a period of 3 hours, at which point it was poured into $H_2O$ and extracted (3×) with $CH_2Cl_2$, dried using anhydrous $MgSO_4$, and concentrated in vacuo. Column chromatography, silica gel (3:1 $CH_2Cl_2$/hexane), afforded 3 as a viscous red oil (5.13 g, 74%). $^1$H NMR (400 MHz, $CDCl_3$) δ 7.65 (d, J=8.8 Hz, 2H), 7.19 (d, J=8.8 Hz, 2H), 3.79 (q, J=7.1 Hz, 4H), 1.25 (s broad, 6H).

EXAMPLE 4(D)

Synthesis of 4: 4-(4-Ethynyl-3-nitro-phenylethynyl)-phenylamine (Flatt et al., J. Org. Chem., 2004, 69:1752-1755)

Following the general coupling procedure (4-iodo-2-nitro-phenylethynyl)-trimethyl-silane (Maya et al., Chem. Mater., 2004, 16:2987-2997) (1.20 g, 3.43 mmol) was coupled to 4-ethynyl-phenylamine (Fan et al., J. Am. Chem. Soc., 2002, 124:5550) (0.44 g, 3.77 mmol) using $PdCl_2(PPh_3)_2$ (0.12 g, 0.17 mmol), CuI (0.06 g, 0.34 mmol), TEA (4 mL), and THF (20 mL). The reaction was stirred at 40° C. for 3 days until the starting material was consumed, as determined by thin layer chromatography (TLC). The reaction was poured into $H_2O$ and extracted (3×) with $CH_2Cl_2$, dried using anhydrous $MgSO_4$ and concentrated in vacuo. Column chromatography, silica gel ($CH_2Cl_2$) afforded the TMS protected alkyne as a yellow solid (0.87 g, 75%). Following the general deprotection of TMS-protected alkynes, the yellow solid (0.87 g, 2.56 mmol) was dissolved in a mixture of $CH_2Cl_2$ (25 mL), MeOH (25 mL), and $K_2CO_3$ (1.77 g, 12.81 mmol). The product 4, was afforded, without additional purification, as an orange solid (0.63 g, 92%). $^1$H NMR (400 MHz, (CD$_3$)$_2$CO) δ 8.09 (t, J=1.1 Hz, 1H), 7.76 (d, J=1.1 Hz, 2H), 7.31 (d, J=8.7 Hz, 2H), 6.70 (d, J=8.7 Hz, 2H), 5.23 (s, 2H), 4.26 (s, 1H).

EXAMPLE 4(E)

Synthesis of 5: 4-{4-[4-(3,3-Diethyl triazene)-phenylethynyl]-3-nitro-phenylethynyl}-phenylamine Following a general coupling procedure, 4 (0.63 g, 2.36 mmol) was coupled to 3 (0.65 g, 2.14 mmol) using PdCl$_2$(PPh$_3$)$_2$ (0.08 g, 0.12 mmol), CuI (0.04 g, 0.21 mmol), TEA (3 mL), and THF (20 mL). The reaction was stirred at room temperature overnight. The reaction was poured into H$_2$O and extracted (3×) with CH$_2$Cl$_2$, dried using anhydrous MgSO$_4$, and concentrated in vacuo. Column chromatography, silica gel (CH$_2$Cl$_2$), afforded 5 as a yellow solid (0.50 g, 53%). Melting point: 172-175° C.; FTIR (KBr) 3496, 3390, 2972, 2204, 1619, 1602, 1538, 1518, 1393, 1343, 1302, 1271, 1099, 844, 829, 530 cm$^{-1}$. $^1$H NMR (400 MHz, (CD$_3$)$_2$CO) δ 8.14 (d, J=0.9 Hz, 1H), 7.77 (d, J=2.9 Hz, 2H), 7.56 (d, J=8.4 Hz, 2H), 7.5 (d, J=8.5 Hz, 2H), 7.32 (d, J=8.5 Hz, 2H), 6.71 (d, J=8.5 Hz, 2H), 5.21 (s, 2H), 3.83 (q, J=8.1 Hz, 4H), 1.32 (s, broad, 3H), 1.23 (s, broad, 3H). $^{13}$C NMR (125 MHz, (CD$_3$)$_2$CO) δ 153.1, 150.9, 150.6, 135.7, 135.3, 134.1, 133.5, 127.3, 125.8, 121.4, 119.0, 117.5, 114.9, 109.6, 99.5, 96.5, 85.60, 85.55. HRMS calculated for C$_{26}$H$_{23}$N$_5$O$_2$ was 437.1852; observed: 437.1844.

EXAMPLE 4(F)

Synthesis of 6:
4-(4-Ethynyl-phenylethynyl)-phenylamine (Lavastre et al., Tetrahedron, 1997, 53:7595-7604)

Following a general coupling procedure, (4-iodo-phenylethynyl)-trimethyl-silane (Maya et al., Chem. Mater., 2004, 16:2987-2997) (0.75 g, 2.50 mmol) was coupled to 4-ethynyl-phenylamine (Fan et al., J. Am. Chem. Soc., 2002, 124: 5550) (0.35 g, 3.00 mmol) using PdCl$_2$(PPh$_3$)$_2$ (0.09 g, 0.13 mmol), CuI (0.05 g, 0.25 mmol), TEA (3 mL), and THF (10 mL). The reaction was stirred at 40° C. overnight. The mixture was poured into H$_2$O and extracted (3×) with CH$_2$Cl$_2$, dried using anhydrous MgSO$_4$, and concentrated in vacuo. Column chromatography, silica gel (CH$_2$Cl$_2$) afforded 4-(4-trimethylsilanylethynyl-phenylethynyl)-phenylamine as a yellow solid (0.64 g). Following the general deprotection of TMS-protected alkynes, 4-(4-trimethylsilanylethynyl-phenylethynyl)-phenylamine (0.64 g, 2.21 mmol) was dissolved in a mixture of CH$_2$Cl$_2$ (15 mL), MeOH (15 mL), and K$_2$CO$_3$ (1.53 g, 11.05 mmol). The product 6, was afforded without additional purification as an orange solid (0.47 g, 87%, 2 steps). $^1$H NMR (400 MHz, (CD$_3$)$_2$CO) δ 7.45 (m, 4H), 7.25 (d, J=6.7 Hz, 2H), 6.68 (d, J=6.7 Hz, 2H), 5.09 (s, 2H), 3.77 (s, 1H).

EXAMPLE 4(G)

Synthesis of 7: 4-{4-[4-(3,3-Diethyl triazene)-phenylethynyl]-phenylethynyl}-phenylamine Following a general coupling procedure, 6 (0.48 g, 2.21 mmol) was coupled to 3 (0.61 g, 2.01 mmol) using PdCl$_2$(PPh$_3$)$_2$ (0.07 g, 0.10 mmol), CuI (0.04 g, 0.20 mmol), TEA (5 mL), and THF (20 mL). The reaction was stirred at room temperature for 1 hour until the starting material was consumed, as determined by TLC. The mixture was poured into H$_2$O and extracted (3×) with CH$_2$Cl$_2$, dried using anhydrous MgSO$_4$, and concentrated in vacuo. The residue was dissolved in a minimal amount of CH$_2$Cl$_2$ followed by the addition of hexane. The CH$_2$Cl$_2$ was carefully removed in vacuo and the precipitate was collected using vacuum filtration to afford 7 as a pale solid (0.62 g, 79%). Melting point: 169-173° C.; FTIR (KBr) 3463, 3371, 2973, 2932, 2208, 1618, 1599, 1519, 1396, 1339, 1291, 1237, 1095, 836, 529 cm$^{-1}$. $^1$H NMR (500 MHz, (CD$_3$)$_2$CO) δ 7.52 (d, J=6.9 Hz, 2H), 7.48 (d, J=6.9 Hz, 2H), 7.42 (d, J=6.8 Hz, 2H), 7.26 (d, J=6.8 Hz, 2H), 6.68 (d, J=6.8 Hz, 2H), 5.20 (s, 2H), 3.83 (q, J=5.6 Hz, 4H), 1.31 (s, broad, 3H), 1.22 (s, broad, 3H). $^{13}$C NMR (100 MHz, (CDCl$_3$) δ 151.3, 147.0, 133.2, 132.5, 131.6, 131.4, 125.0, 123.7, 123.0, 120.6, 119.4, 115.0, 112.6, 92.2 91.9, 89.3, 87.5. HRMS calculated for C$_{26}$H$_{24}$N$_4$ was 392.2001; observed: 392.2011.

All patents and publications referenced herein are hereby incorporated by reference. It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

What is claimed is the following:

1. A method comprising the steps of:
    a) reacting a Si surface with a quantity of functionalizing agent to form a functionalized Si surface,
    wherein the functionalizing agent comprises an oligo(phenylene ethynylene) comprising an aniline end and a diazonium end, and
    wherein the reacting is carried out in the presence of HF so as to provide for a continual hydride passivation of the Si surface;
    b) dispersing a quantity of CNTs in a solvent to form dispersed CNTs; and
    c) reacting the functionalized Si surface with the dispersed CNTs to form a CNT-Si composite structure comprising CNTs molecularly grafted to the Si surface,
    wherein during the reacting step, the aniline end of the oligo(phenylene ethynylene) is converted to a diazonium species by treatment with a converting species selected from the group consisting of inorganic nitrites, organic nitrites, alkyl nitrites, sodium nitrites, potassium nitrites, NOBF$_4$, and combinations thereof.

2. The method of claim 1, wherein the Si surface is selected from the group consisting of (a) amorphous silicon; (b) crystalline silicon, having a crystalline surface selected from the group consisting of <100>, <111>, and combinations thereof; (c) polysilicon; and (d) combinations thereof.

3. The method of claim 1, wherein the step of reacting the Si surface to form a functionalized Si surface is carried out in a solvent selected from the group consisting of aqueous solvents, organic solvents, supercritical solvents, and combinations thereof.

4. The method of claim 1, wherein the quantity of CNTs comprises carbon nanotubes selected from the group consisting of multi-wall carbon nanotubes, single-wall carbon nanotubes, small diameter carbon nanotubes, double-wall carbon nanotubes, buckytubes, fullerene tubes, carbon fibrils, and combinations thereof.

5. The method of claim 1, wherein at least some of the CNTs are at least partially functionalized prior to the step of reacting them with the functionalized Si surface.

6. The method of claim 5, wherein the partial functionalization of the CNTs facilitates the dispersing of the quantity of CNTs.

7. The method of claim 1, wherein the CNTs are dispersed in a solvent selected from the group consisting of aqueous solvents, organic solvents, supercritical solvents, and combinations thereof.

8. The method of claim 1, wherein, during the dispersing step, a dispersal agent is used to facilitate said dispersing, wherein said dispersal agent is selected from the group consisting of surfactants, polymers operable for wrapping the CNTs, and combinations thereof.

9. The method of claim 1, wherein the step of reacting the functionalized Si surface with the dispersed CNTs is done in a spatially predefined manner.

10. A method comprising the steps of:
a) reacting a Si surface with a quantity of functionalizing agent to form a functionalized Si surface,
wherein the functionalizing agent comprises an oligo(phenylene ethynylene) comprising an aniline end and a diazonium end, and
wherein the reacting is carried out in the presence of HF so as to provide for a continual hydride passivation of the Si surface; and
b) reacting the functionalized Si surface with CNTs to form a CNT-Si composite structure comprising CNTs molecularly grafted to the Si surface,
wherein during the reacting step, the aniline end of the oligo(phenylene ethynylene) is converted to a diazonium species by treatment with a converting species selected from the group consisting of inorganic nitrites, organic nitrites, alkyl nitrites, sodium nitrites, potassium nitrites, $NOBF_4$, and combinations thereof.

11. The method of claim 10, wherein the CNTs are dispersed in a solvent and reacted with the functionalized Si surface as dispersed CNTs.

12. The method of claim 10, wherein the CNTs are reacted with the functionalized Si surface in the absence of solvent.

13. The method of claim 10, wherein the Si surface is selected from the group consisting of (a) amorphous silicon; (b) crystalline silicon, having a crystalline surface selected from the group consisting of <100>, <111>, and combinations thereof; (c) polysilicon; and (d) combinations thereof.

14. The method of claim 10, wherein the quantity of CNTs comprises carbon nanotubes selected from the group consisting of multi-wall carbon nanotubes, single-wall carbon nanotubes, small diameter carbon nanotubes, double-wall carbon nanotubes, buckytubes, fullerene tubes, carbon fibrils, and combinations thereof.

\* \* \* \* \*